(12) United States Patent
Yeh et al.

(10) Patent No.: US 8,759,186 B2
(45) Date of Patent: Jun. 24, 2014

(54) SEMICONDUCTOR DEVICE AND METHOD FOR MANUFACTURING THE SAME

(75) Inventors: Yung-Hui Yeh, Hsinchu (TW);
Chih-Ming Lai, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 37 days.

(21) Appl. No.: 13/354,334

(22) Filed: Jan. 20, 2012

(65) Prior Publication Data
US 2013/0126859 A1 May 23, 2013

(30) Foreign Application Priority Data

Nov. 21, 2011 (TW) .............................. 100142527 A

(51) Int. Cl.
*H01L 33/08* (2010.01)

(52) U.S. Cl.
USPC ............. 438/301; 438/29; 438/181; 438/249; 438/251

(58) Field of Classification Search
USPC ............... 257/43; 438/29, 181, 249, 251, 301
See application file for complete search history.

(56) References Cited

U.S. PATENT DOCUMENTS

| | | | | |
|---|---|---|---|---|
| 5,817,550 | A * | 10/1998 | Carey et al. | 438/166 |
| RE39,988 | E * | 1/2008 | Wickboldt et al. | 438/535 |
| 7,427,776 | B2 * | 9/2008 | Hoffman et al. | 257/59 |
| 7,575,966 | B2 * | 8/2009 | Lai et al. | 438/153 |
| 7,767,520 | B2 * | 8/2010 | Kamath et al. | 438/249 |
| 7,993,992 | B2 * | 8/2011 | Ohtani et al. | 438/151 |
| 8,071,981 | B2 * | 12/2011 | Yamazaki et al. | 257/59 |
| 8,129,721 | B2 * | 3/2012 | Yamazaki et al. | 257/72 |
| 8,304,780 | B2 * | 11/2012 | Kamath et al. | 257/66 |
| 2003/0067007 | A1 * | 4/2003 | Morosawa | 257/72 |
| 2008/0044964 | A1 * | 2/2008 | Kamath et al. | 438/164 |
| 2010/0041187 | A1 * | 2/2010 | Takemura et al. | 438/164 |
| 2010/0193784 | A1 * | 8/2010 | Morosawa et al. | 257/43 |

FOREIGN PATENT DOCUMENTS

| | | |
|---|---|---|
| CN | 1090427 | 8/1994 |
| TW | 201005950 | 2/2010 |

OTHER PUBLICATIONS

Lee et al., "68.2: 3.5 Inch QCIF+ AM-OLED Panel Based on Oxide TFT Backplane," SID 07 Digest, 2007, p. 1826-1829.
Byun et al, "Transparent and High-Aperture-Ratio AMOLED Panel Using Very Stable ZnO TFTs," IDW, 2007, p. 1787-1788.
Hayashi et al., "42.1: Invited Paper: Improved Amorphous In—Ga—Zn—O TFTs," SID 08 Digest, 2008, p. 621-624.
Morosawa et al., "35.3: Distinguished Paper: A Novel Self-Aligned Top-Gate Oxide TFT for AM-OLED Displays," SID 11 Digest, 2011, p. 479-482.

\* cited by examiner

*Primary Examiner* — Julio J Maldonado
*Assistant Examiner* — Jaehwan Oh
(74) *Attorney, Agent, or Firm* — Jianq Chyun IP Office

(57) ABSTRACT

A method for manufacturing a semiconductor device includes forming a metal oxide semiconductor layer and a first insulating layer on a substrate. A gate is formed on the first insulating layer. The first insulating layer is patterned by using the gate as an etching mask so as to expose the metal oxide semiconductor layer to serve as a source region and a drain region. A dielectric layer is formed on the substrate to cover the gate and the oxide semiconductor layer, where the dielectric layer has at least one of hydrogen group and hydroxyl group. A heating treatment is performed so that the at least one of hydrogen group and hydroxyl group reacts with the source region and the drain region. A source electrode and a drain electrode electrically connected to the source region and the drain region respectively are formed on the dielectric layer.

19 Claims, 9 Drawing Sheets

SEMICONDUCTOR DEVICE AND METHOD FOR MANUFACTURING THE SAME

CROSS-REFERENCE TO RELATED APPLICATION

This application claims the priority benefit of Taiwan application Ser. No. 100142527, filed on Nov. 21, 2011. The entirety of the above-mentioned patent application is hereby incorporated by reference herein and made a part of this specification.

BACKGROUND

1. Technical Field

The disclosure relates to a semiconductor device and a method for manufacturing the same, in particular, to a self-aligned top gate type thin-film transistor and a method for manufacturing the same.

2. Related Art

In recent years, with the advancement of the semiconductor manufacturing technology, the manufacturing of an active device has become easier and faster. The active device has been widely used as, for example, a computer chip, a cell-phone chip, or an active-device display. Taking the active-device display as an example, the active device may be used as a switch for charging or discharging. In order to ensure the active device with high reliability and high display quality, the active device is required to have a high-passing current under an on-state and to have a low-leakage current under the off-state.

In addition, current metal oxide semiconductor thin-film transistors are commonly made by bottom gate type thin-film transistor. The main reason is that a processing apparatus for manufacturing the bottom gate type thin-film transistor is compatible to an apparatus for manufacturing a conventional amorphous silicon thin-film transistor. However, the bottom gate type metal oxide semiconductor thin-film transistor has a poor resistance to water and oxygen species. On the other hand, the conventional top gate type metal oxide semiconductor thin-film transistor has a good resistance to water and oxygen species but without a self-alignment process. Therefore, the conventional top gate type metal oxide semiconductor thin-film transistor has a large device parasitic capacitance, requires a large device layout area which does not help the development of a high-resolution panel, and has a poor frequency response with the reliability of the device to be enhanced.

SUMMARY

The disclosure provides a semiconductor device and a method for manufacturing the same. The method includes: sequentially forming a metal oxide semiconductor layer and a first insulating layer on a substrate; forming a gate on the first insulating layer; patterning the first insulating layer by using the gate as an etching mask so as to expose the metal oxide semiconductor layer on two sides of the gate to serve as a source region and a drain region; forming a dielectric layer to cover the gate and the metal oxide semiconductor layer, where the dielectric layer has at least one of hydrogen group (—H) and hydroxyl group (—OH); performing a heating treatment so as to make the at least one of hydrogen group and hydroxyl group in the dielectric layer to react with the source region and the drain region; and forming a source electrode and a drain electrode on the dielectric layer, where the source electrode and the drain electrode are electrically connected to the source region and the drain region respectively.

A method for manufacturing a semiconductor device is introduced herein, which includes: sequentially forming a metal oxide semiconductor layer and a first insulating layer on a substrate; forming a gate on the first insulating layer; patterning the first insulating layer by using the gate as an etching mask so as to expose the metal oxide semiconductor layer on two sides of the gate to serve as a source region and a drain region; forming a doped layer to cover the gate and the metal oxide semiconductor layer, where the doped layer comprises at least one of hydrogen group and hydroxyl group, or comprises a dopant comprising indium (In), aluminum (Al), gallium (Ga), stannum (Sn), zinc (Zn) or hafnium (Hf); performing a heating treatment so as to make the at least one of hydrogen group and hydroxyl group in the doped layer to react with the source region and the drain region, or to make the dopant of the doped layer diffusing to the source region and the drain region; removing the doped layer; forming a dielectric layer to cover the gate, the source region and the drain region; and forming a source electrode and a drain electrode on the dielectric layer, where the source electrode and the drain electrode are electrically connected to the source region and the drain region respectively.

A semiconductor device is introduced herein, which includes a metal oxide semiconductor layer having a source region and a drain region, where a surface of the source region and the drain region has at least one of hydrogen group and hydroxyl group; a first insulating layer, located on the metal oxide semiconductor layer, where the first insulating layer does not cover the source region and the drain region; a gate, located on the first insulating layer; a dielectric layer, covering the gate and the source region and the drain region of the metal oxide semiconductor layer; a source electrode and a drain electrode, located on the dielectric layer and electrically connected to the source region and the drain region respectively.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
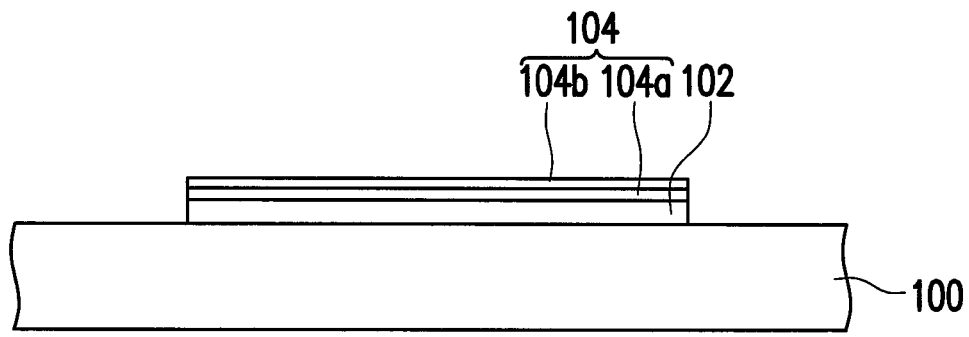
FIG. 1A to FIG. 1E are schematic flowcharts of a method for manufacturing a thin-film transistor according to an exemplary embodiment.

FIG. 1A to FIG. 1E are schematic flowcharts of a method for manufacturing a thin-film transistor according to an exemplary embodiment. Referring to FIG. 1A, in the method of manufacturing a thin-film transistor provided in an exemplary embodiment, a metal oxide semiconductor layer 102 and a first insulating layer 104 are formed sequentially on a substrate 100.

The substrate 100 may use a flexible base material (such as an organic polymer base material or a metal base material) or a rigid base material (such as a glass base material or a quartz base material). If the thin-film transistor is used in a flexible apparatus, the substrate 100 usually selects a flexible material.

The material of the metal oxide semiconductor layer 102 includes ZnO doped with In, Al, Ga, Sn, or Hf. For example, the metal oxide semiconductor layer 102 includes Indium-Gallium-Zinc Oxide (IGZO), ZnO, SnO, Indium-Zinc Oxide (IZO), Gallium-Zinc Oxide (GZO), Zinc-Tin Oxide (ZTO), Indium-Aluminum-Tin Oxide (InAlZnO), Indium-Tin-Zinc Oxide (InSnZnO), Indium-Hafnium-Zinc Oxide (InHfZnO), or Indium-Tin Oxide (ITO).

In addition, in this exemplary embodiment, the first insulating layer 104 includes an intermediate layer 104a and a barrier layer 104b, where the intermediate layer 104a is located between the barrier layer 104b and the metal oxide semiconductor layer 102. However, in this exemplary embodiment, the first insulating layer 104 is not limited herein to be a two-layered structure (including the intermediate layer 104a and the barrier layer 104b). In other words, in other embodiments, the first insulating layer 104 may also be a single-layered structure, for example, the first insulating layer 104 may be the barrier layer 104b.

Base on the foregoing description, in this exemplary embodiment, the first insulating layer 104 includes the intermediate layer 104a and the barrier layer 104b. The barrier layer 104b is disposed to block moisture and oxygen in an environment so as to prevent adverse effects on the metal oxide semiconductor layer 102 caused by the moisture and the oxygen in the environment. Here, the material of the barrier layer 104b includes silicon nitride ($SiN_X$), aluminium oxide, or other moisture-resistant and oxidation-resistant materials. In addition, the intermediate layer 104 is used to serve as a boundary layer or compatibility layer between the metal oxide semiconductor layer 102 and the barrier layer 104b. So, the material adopted in the intermediate layer 104a is related to the material of the metal oxide semiconductor layer 102 and the material of the barrier layer 104b. For example, if $SiN_X$ is adopted in the barrier layer 104b and the ZnO doped with In, Al, Ga, Sn, or Hf is adopted in the metal oxide semiconductor layer 102, the intermediate layer 104a may use silicon oxide or metal oxide insulating thin film (such as $Y_2O_3$, $Ta_2O_5$, or $HfO_2$). However, the disclosure is not limited hereto.

According to this embodiment, the method of forming the metal oxide semiconductor layer 102 and the first insulating layer 104 on the substrate 100 is, for example, forming a metal oxide semiconductor material (not shown) and an insulating material (not shown) on the substrate 100 sequentially by using a deposition process (such as a chemical vapor deposition process, a physical vapor deposition process, or a sputtering process), a coating process (such as a spin coating process), or another appropriate process. And then, the metal oxide semiconductor material and the insulating material are patterned by using a lithography process and an etching process, so as to form the platform-shaped metal oxide semiconductor layer 102 and the first insulating layer 104.

According to other embodiments, an ink jet printing process, a screen printing process or other appropriate processes may also be adopted in the forming of the metal oxide semiconductor layer 102 and the first insulating layer 104, so as to directly form the platform-shaped metal oxide semiconductor layer 102 and the first insulating layer 104.

Figure 1B:
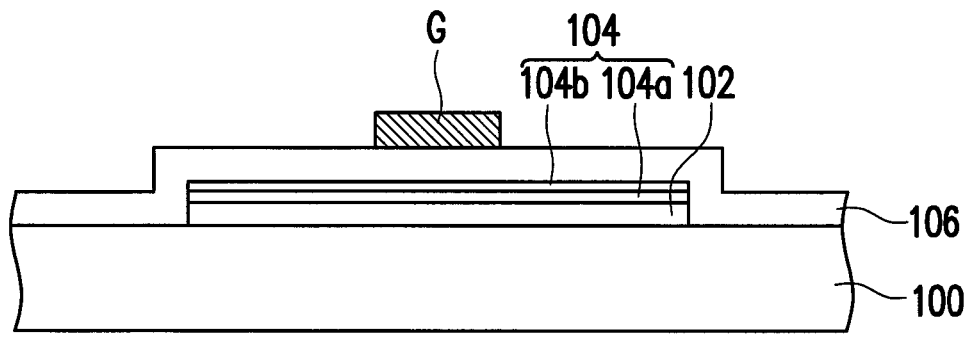

Referring to FIG. 1B, a second insulating layer 106 is formed on the first insulating layer 104. The material of the second insulating layer 106 comprises, for example, an inorganic insulating material (such as silicon oxide, $SiN_X$, silicon oxynitride or other inorganic materials) or an organic material (such as PVP, PVA, polyacrylates, Ci-PVP, parylenes, or photoacryl (PC403 from JSR co.)). Forming the second insulating layer 106 on the first insulating layer 104 may increase the flexibility of a device. However, the second insulating layer 106 is not an integrant layer, so the second insulating layer 106 may be considered to be omitted in other embodiments of the disclosure. This exemplary embodiment takes that the second insulating layer 106 is formed on the first insulating layer 104, the metal oxide semiconductor layer 102 and the substrate 100 as an example for description.

Thereafter, a gate G is formed on the second insulating layer 106. In this exemplary embodiment, the method of forming the gate G is, for example, forming a conductive layer on the second insulating layer 106, and then patterning the conductive layer by using the lithography and etching process, so as to define the gate G. In another embodiment, the gate G may also be directly formed on the second insulating layer 106 by using the ink-jet printing or the screen printing method. Based on the consideration of conductivity, a metal material is usually used in the gate G. However, the disclosure is not limited hereto. According to other embodiments, other conductive materials such as an alloy, a nitride of a metal material, an oxide of a metal material and a nitrogen oxide of a metal material may also be used in the gate G.

Figure 1C:
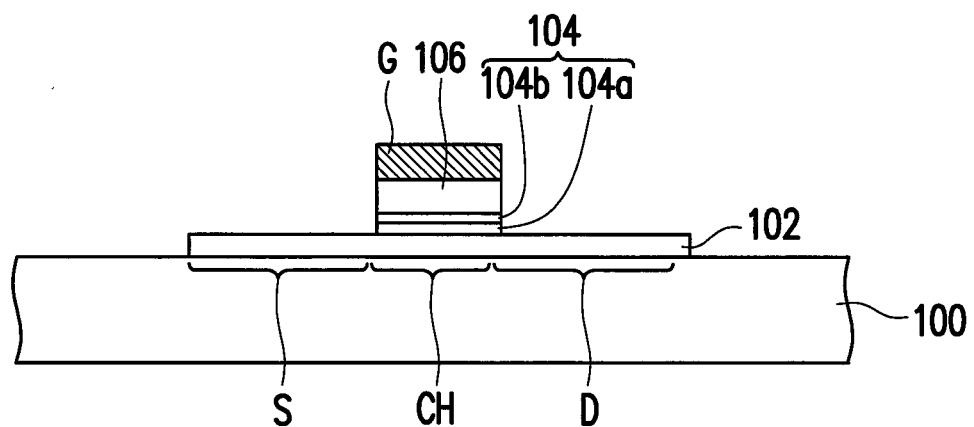

Referring to FIG. 1C, the second insulating layer 106 and the first insulating layer 104 are patterned by using the gate G as an etching mask, so as to expose the metal oxide semiconductor layer 102 on two sides of the gate G to serve as a source region S and a drain region D, where the region between the source region S and the drain region D is set to be a channel region CH. At this time, the gate G, the second insulating layer 106, and the first insulating layer 104 form a stacked structure; and the gate G, the second insulating layer 106 and the first insulating layer 104 in the stacked structure have the same pattern. In this exemplary embodiment, the second insulating layer 106 and the first insulating layer 104 located below the gate G serve as insulting layers of the gate.

Figure 1D:
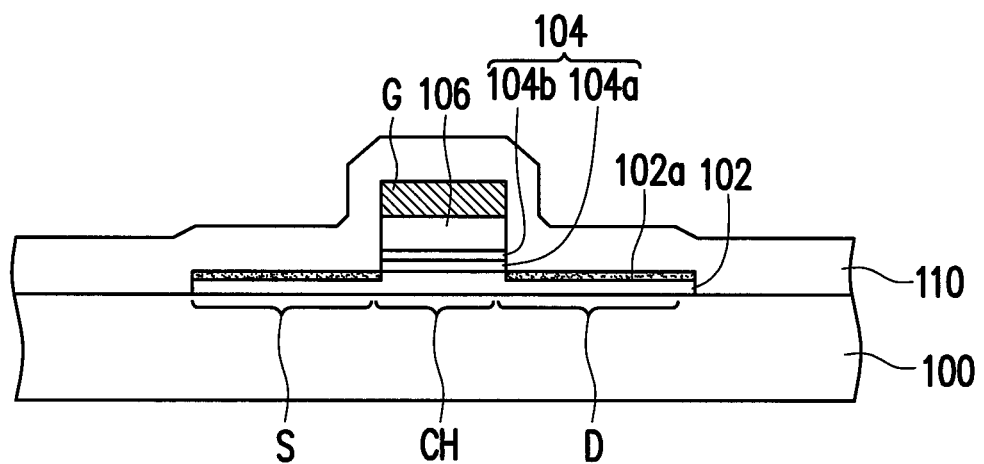

Referring to FIG. 1D, a dielectric layer 110 is formed on the substrate 100 to cover the gate G and the metal oxide semiconductor layer 102. Especially, the dielectric layer 110 includes at least one of hydrogen group and hydroxyl group. The aforesaid dielectric layer 110 may include organic insulating material or inorganic insulating material. The organic insulating material includes PVP, PVA, polyacrylates, Ci-PVP, or other organic insulating materials. The inorganic insulating material includes $SiN_X$, silicon oxide, or other inorganic insulating materials. In addition, according to this exemplary embodiment, the concentration of the at least one of hydrogen group and hydroxyl group in the dielectric layer 110 is higher than $1E18$ $cm^{-3}$. The concentration of the hydrogen group or the hydroxyl group in the dielectric layer is measured by using a secondary ion mass spectrometer (SIMS). It should be noted that, the first insulating layer 104 above the source region S and drain region D is removed in the patterning process, so the dielectric layer 110 may directly contact with the source region S and the drain region D.

Subsequently, a heating treatment is performed, so that the at least one of hydrogen group and hydroxyl group in the dielectric layer 110 reacts with the metal oxide semiconductor layer 102 of the source region S and the drain region D to form a conductive region 102a. In other words, the conductive region 102a is formed after the source region S and the drain region D of the metal oxide semiconductor layer 102 react with the at least one of hydrogen group and hydroxyl group, which may increase the conductivity of the source region S and the drain region D. Therefore, the conductivity of the source region S and the drain region D at this time is higher than that of the channel region CH. According to this exemplary embodiment, the temperature of the heating treatment is, for example, between 100° C. and 500° C.; the environment of the heating treatment may be an atmospheric environment, nitrogen gas, oxygen gas, inert gas, or under a low pressure between $10^{-3}$ torr and $10^{-6}$ ton; and the time of the heating treatment is set to be between 4 hours and 10 minutes according to the change of the temperature and the pressure. However, the disclosure is not limited hereto. According to other embodiments, the heating treatment may also be other treatment processes which enable the at least one of hydrogen group and hydroxyl group in the dielectric layer 110 to react with the metal oxide semiconductor layer 102 of the source region S and the drain region D.

It should be noted that, while performing the aforesaid heating treatment, the channel region CH of the metal oxide semiconductor layer 102 is covered by the gate G, the second insulating layer 106 and the first insulating layer 104, and the barrier layer 104b in the first insulating layer 104 is capable of blocking hydrogen group and hydroxyl group to prevent them from reacting with the channel region CH of the metal oxide semiconductor layer 102. Therefore, the electrical property of the channel region CH will not be changed, and the electrical stability of the thin-film transistor is thus maintained.

Figure 1E:
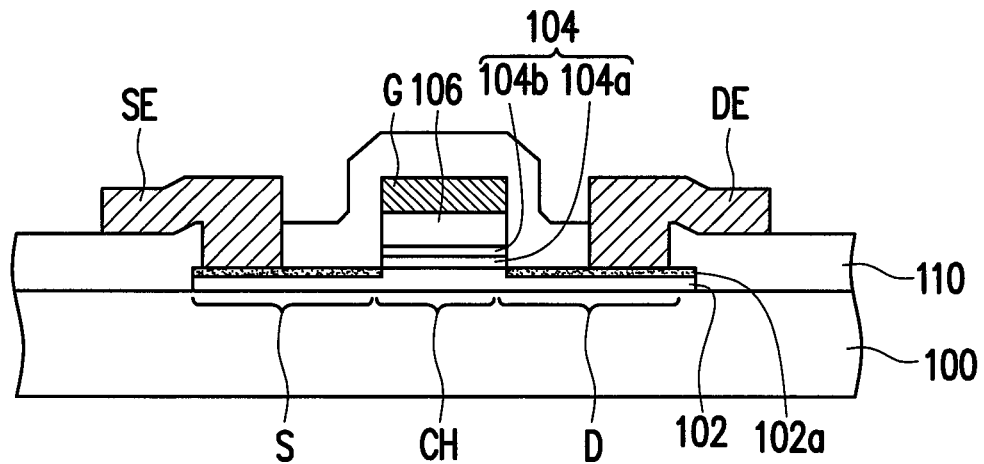

Referring to FIG. 1E, a source electrode SE and a drain electrode DE are formed on the dielectric layer 110, where the source electrode SE and the drain electrode DE are electrically connected to the source region S and the drain region D respectively. According to this exemplary embodiment, the source electrode SE and a drain electrode DE are electrically connected to the source region S and the drain region D respectively through a contact window in the dielectric layer 110.

Figure 2A:
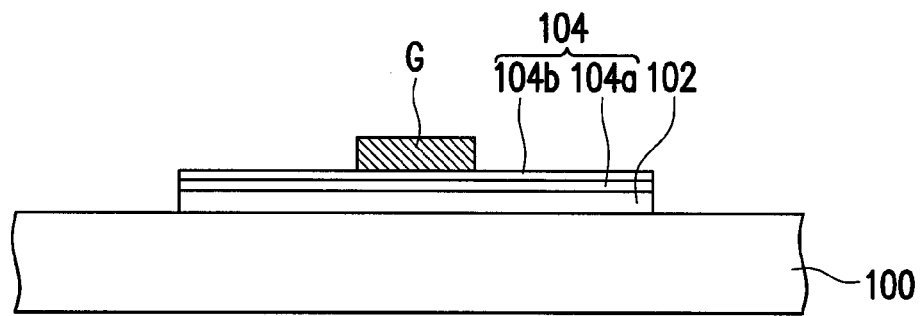
FIG. 2A to FIG. 2C are schematic flowcharts of a method for manufacturing a thin-film transistor according to another exemplary embodiment.
Figure 2B:
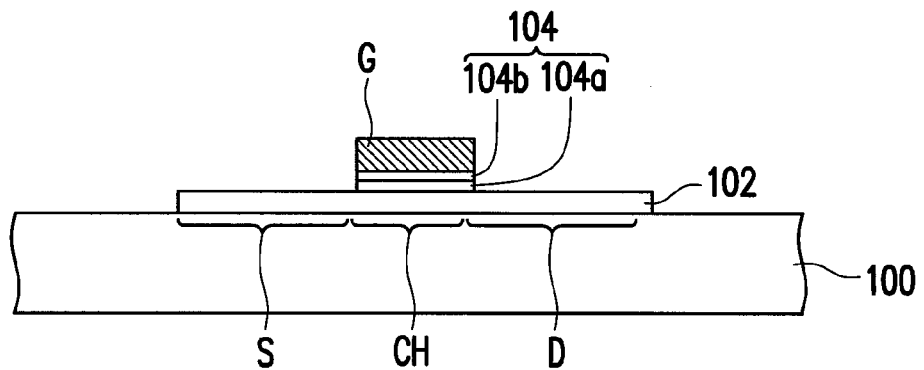
Figure 2C:
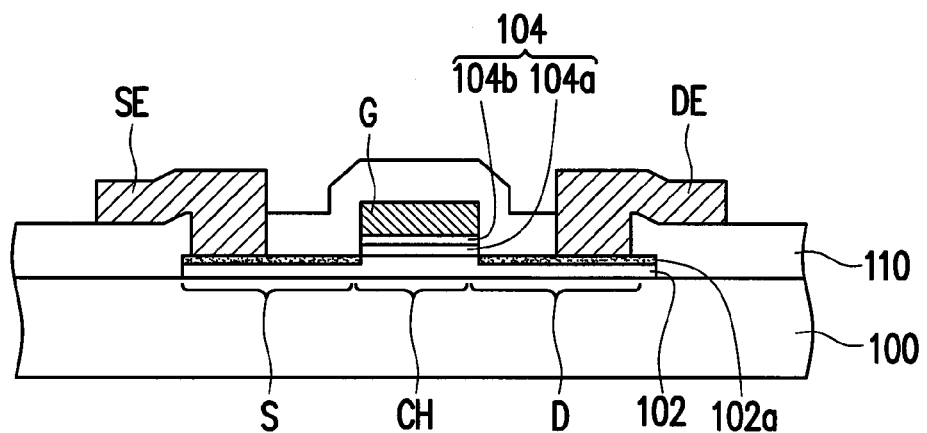

FIG. 2A to FIG. 2C are schematic flowcharts of a method for manufacturing a thin-film transistor according to another exemplary embodiment. The exemplary embodiment shown in FIG. 2A to FIG. 2C is similar to that of FIG. 1A to FIG. 1E, therefore, the same element are indicated with the same symbols, and are not be redescribed here. Referring to FIG. 2A, in this exemplary embodiment, after forming a metal oxide semiconductor layer 102 and a first insulating layer 104 on the substrate 100, a gate G is directly formed on the first insulating layer 104. In other words, the manufacturing of a second insulating layer is omitted in this exemplary embodiment. The method of forming the metal oxide semiconductor layer 102, the first insulating layer 104 and the gate G is the same as or similar to the previous exemplary embodiment.

Referring to FIG. 2B, the first insulating layer 104 is patterned by using the gate G as an etching mask, so as to expose the metal oxide semiconductor layer 102 on two sides of the gate G to serve as a source region S and a drain region D. At this time, the gate G and the first insulating layer 104 form a stacked structure; and the gate G and the first insulating layer 104 in the stacked structure have the same pattern. In this exemplary embodiment, the first insulating layer 104 (a barrier layer 104b and an intermediate layer 104a) located below the gate G serves as an insulting layer of the gate.

Referring to FIG. 2C, a dielectric layer 110 is formed on the substrate 100 to cover the gate G and the metal oxide semiconductor layer 102. Especially, the dielectric layer 110 has at least one of hydrogen group and hydroxyl group. Subsequently, a heating treatment is performed, so that the at least one of hydrogen group and hydroxyl group in the dielectric layer 110 reacts with the metal oxide semiconductor layer 102 of the source region S and the drain region D to make the source region S and the drain region D of the metal oxide semiconductor layer have a conductive region 102a. In other words, the conductive region 102a is formed after the source region S and the drain region D of the metal oxide semiconductor layer 102 react with the at least one of hydrogen group and hydroxyl group, which may increase the conductivity of the source region S and the drain region D. Therefore, the conductivity of the source region S and the drain region D at this time is higher than that of a channel region CH. After then, a source electrode SE and a drain electrode DE are formed on the dielectric layer 110, where the source electrode SE and the drain electrode DE are electrically connected to the source region S and the drain region D respectively.

Figure 3A:
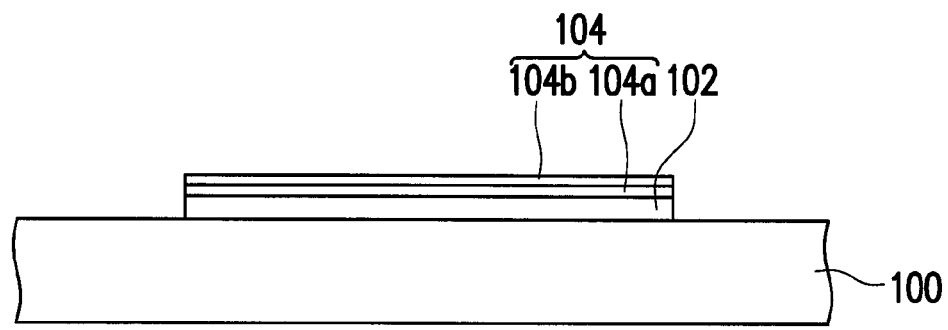
FIG. 3A to FIG. 3G are schematic flowcharts of a method for manufacturing a thin-film transistor according to still another exemplary embodiment.

FIG. 3A to FIG. 3G are schematic flowcharts of a method for manufacturing a thin-film transistor according to still another exemplary embodiment. Referring to FIG. 3A, a metal oxide semiconductor layer 102 and a first insulating layer 104 are sequentially formed on a substrate 100. The method of forming the metal oxide semiconductor layer 102 and the first insulating layer 104 on the substrate 100 is the same as or similar to that of FIG. 1A.

Figure 3B:
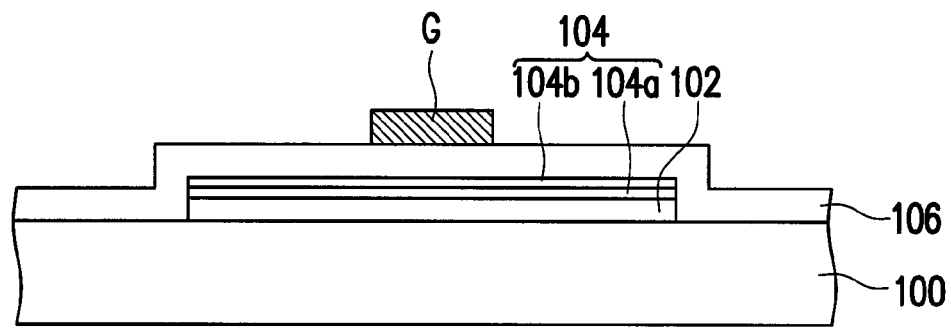

Referring to FIG. 3B, a second insulating layer 106 is formed on the first insulating layer 104, and then a gate G is formed on the second insulating layer 106. The method of forming the second insulating layer 106 and the gate G is the same as or similar to that of FIG. 1B.

Figure 3C:
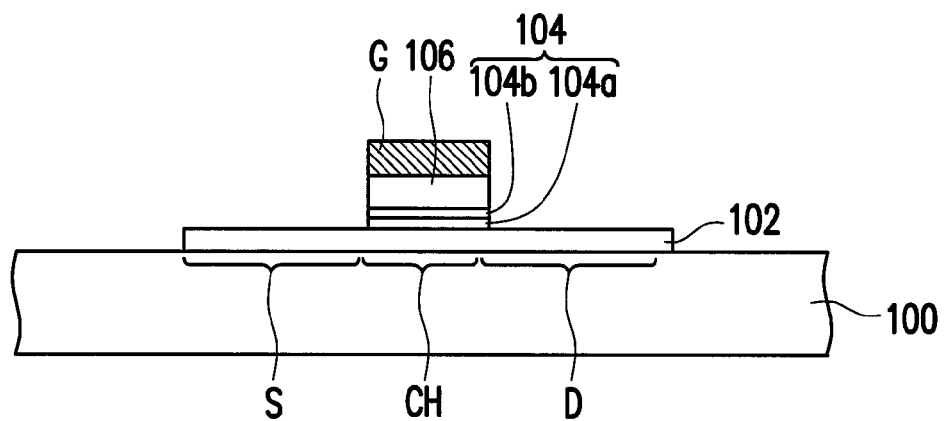

Referring to FIG. 3C, the second insulating layer 106 and the first insulating layer 104 are patterned by using the gate G as an etching mask, so as to expose the metal oxide semiconductor layer 102 on two sides of the gate G to serve as a source region S and a drain region D. At this time, the gate G, the second insulating layer 106, and the first insulating layer 104 form a stacked structure; and the gate G, the second insulating layer 106 and the first insulating layer 104 in the stacked structure have the same pattern. This exemplary embodiment takes that the second insulating layer 106 is formed on the first insulating layer 104, the metal oxide semiconductor layer 102 and the substrate 100 as an example for description.

Likewise, according to another exemplary embodiment, in the steps of FIG. 3B and FIG. 3C, the manufacturing of the second insulating layer 106 may also be omitted, that is, the gate G is directed formed on the first insulating layer 104. So, after patterning the first insulating layer 104 by using the gate G as the etching mask, the formed stacked structure includes the gate G and the first insulating layer 104.

Figure 3D:
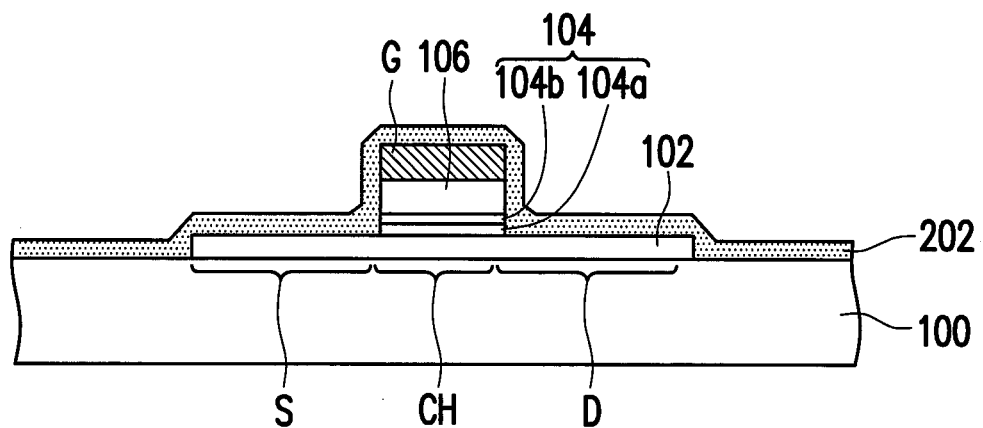

Referring to FIG. 3D, a doped layer 202 is formed to cover the gate G and the metal oxide semiconductor layer 102, where the doped layer 202 includes at least one of hydrogen group and hydroxyl group, or includes a dopant comprising In, Al, Ga, Sn, Zn or Hf. More specifically, the main material of the doped layer 202 is a dielectric material (such as silicon oxide, $SiN_X$ and PVP). The dielectric material includes at least one of the hydrogen groups or the hydroxyl groups, or includes In, Al, Ga, Sn, Zn or Hf. According to this exemplary embodiment, the concentration of the at least one of hydrogen group and hydroxyl group in the doped layer 202 is higher than 1E18 cm$^{-3}$ or the concentration of the In, Al, Ga, Sn, Zn or Hf in the doped layer 202 is higher than 1E18 cm$^{-3}$. The concentration of the hydrogen group or the hydroxyl group in the doped layer 202 or the concentration of the In, Al, Ga, Sn, Zn or Hf is measured by using a SIMS. It should be noted that, the first insulating layer 104 above the source region S and drain region D is removed in the patterning process, so the doped layer 202 may directly contact with the source region S and the drain region D.

Figure 3E:
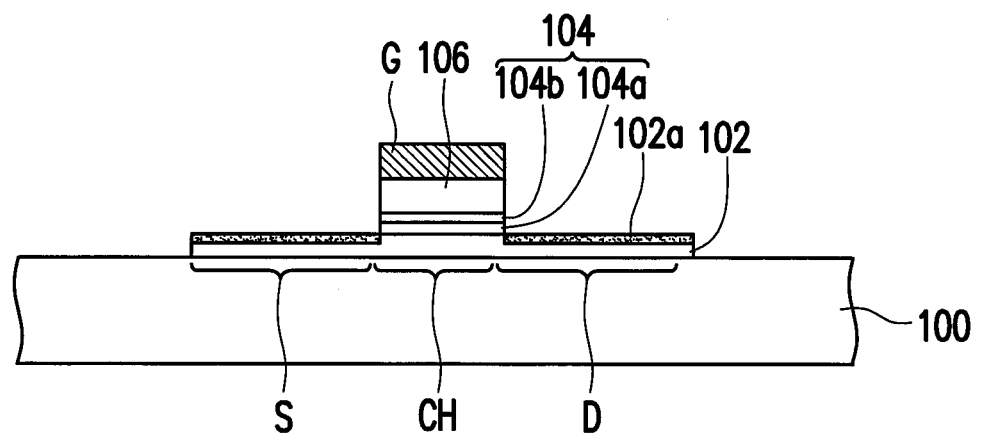

Subsequently, a heating treatment is performed, so that the at least one of hydrogen group and hydroxyl group in the doped layer 202 reacts with the metal oxide semiconductor layer 102 of the source region S and the drain region D, or the In, Al, Ga, Sn, Zn or Hf is diffused to the source region S and the drain region D. After the at least one of hydrogen group and hydroxyl group reacts with the source region S and the drain region D of the metal oxide semiconductor layer 102, or after the In, Al, Ga, Sn, Zn or Hf is diffused to the source region S and the drain region D of the metal oxide semiconductor layer 102, or the hydroxyl group in the metal oxide semiconductor layer 102 are diffused to the doped layer 202 and combined with a doped metal to make a surface of the metal oxide semiconductor layer in an oxygen deficit condition, the source region S and the drain region D of the metal oxide semiconductor layer 102 are enabled to have a conductive region 102a, which increases the conductivity of the source region S and the drain region D. Therefore, the conductivity of the source region S and the drain region D at this time is higher than that of the channel region CH, which is shown in FIG. 3E. For the heating treatment, for example, the temperature is between 100° C. and 500° C., the gas environment may be an atmospheric environment, nitrogen gas, oxygen gas, inert gas, or under a low pressure between 10$^{-3}$ torr and 10$^{-6}$ torr. The temperature, pressure, and time may be set by persons of ordinary skills in the art according to actual requirements. However, the disclosure is not limited hereto.

It should be noted that, while performing the aforesaid heating treatment, the channel region CH of the metal oxide semiconductor layer 102 is covered by the gate G and the first insulating layer 104, and the barrier layer 104b in the first insulating layer 104 is capable of blocking hydrogen group and hydroxyl group to prevent them from reacting with the channel region CH of the metal oxide semiconductor layer 102. So, the property of the channel region CH will not be changed, and therefore the electrical stability of the thin-film transistor is maintained.

After performing the treatment process, the doped layer 202 is removed. The method of removing the doped layer 202 may be, for example, a wet-etching removing method or another appropriate method.

Figure 3F:
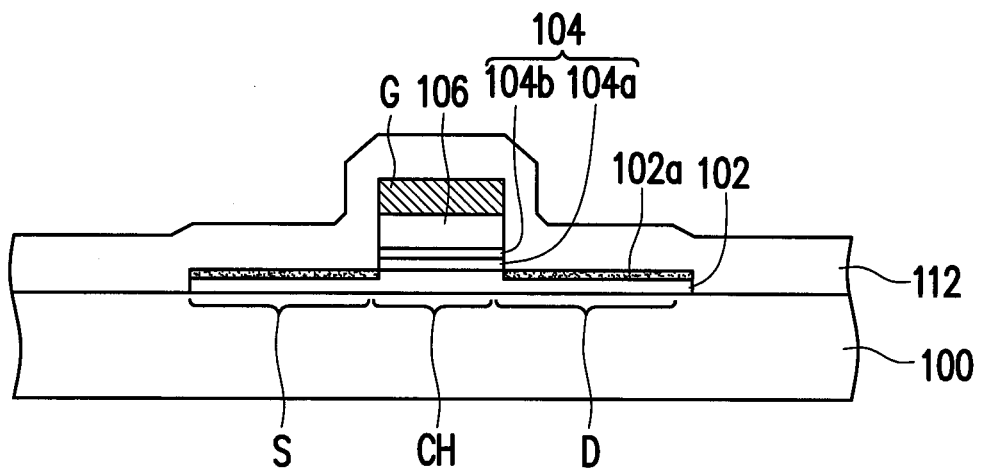

Referring to FIG. 3F, a dielectric layer 112 is formed on the substrate 100. According to this exemplary embodiment, the material of the dielectric layer 112 may be an inorganic insulating material (such as silicon oxide, SiN$_X$ or aluminium oxide), or an organic insulating material (such as PVP). In addition, the dielectric layer 112 may also include a small amount of hydrogen group (—H) or hydroxyl group (—OH).

Referring to FIG. 3F, a source electrode SE and a drain electrode DE are formed on the dielectric layer 112, where the source electrode SE and the drain electrode DE are electrically connected to the source region S and the drain region D respectively. According to this exemplary embodiment, the source electrode SE and a drain electrode DE are electrically connected to the source region S and the drain region D respectively through a contact window in the dielectric layer 112.

Based on the foregoing description, the thin-film transistor formed in each of the aforesaid exemplary embodiments (referring to FIG. 1E, FIG. 2C, or FIG. 3G) includes a metal oxide semiconductor layer 102, a gate G, a second insulating layer 106, a first insulating layer 104, a dielectric layer 110 or 112, a source electrode SE, and a drain electrode DE. The metal oxide semiconductor layer 102 includes a channel region CH, a source region S, and a drain region D. A surface of the source region S and the drain region D of the metal oxide semiconductor layer 102 includes at least one of hydrogen group and hydroxyl group (i.e., a conductive region 102a). The gate G is located above the metal oxide semiconductor layer 102. The second insulating layer 106 and the first insulating layer 104 are located between the metal oxide semiconductor layer 102 and the gate G. The dielectric layer 110 or 112 covers the gate G, the source region S and the drain region D of the metal oxide semiconductor layer 102. The source electrode SE and the drain electrode DE are located on the dielectric layer 110 or 112. The source electrode SE and the drain electrode DE are electrically connected to the source region S and the drain region D respectively.

Figure 4:
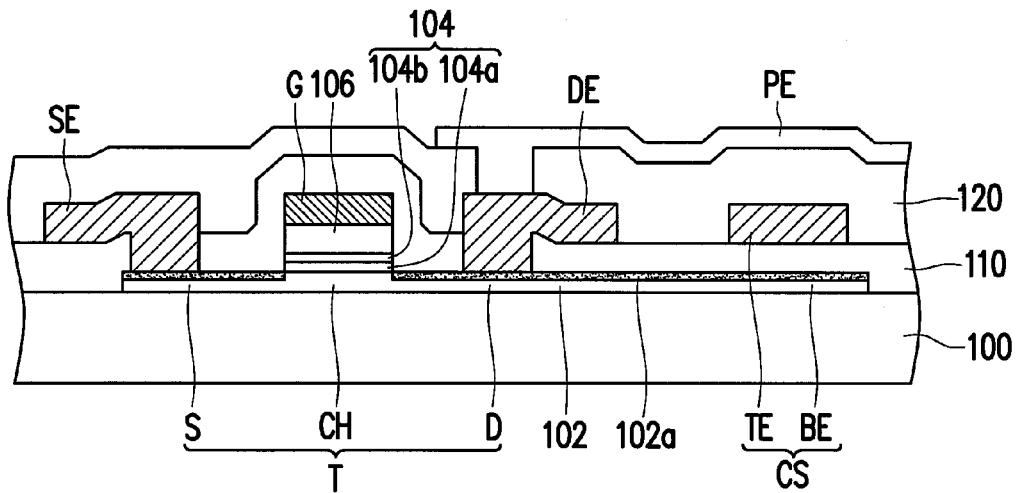
FIG. 4 is a schematic cross-sectional view of a pixel structure according to an exemplary embodiment.

The thin-film transistor may be used in a pixel structure of a display. For example, if the thin-film transistor is used in a pixel structure of a liquid crystal display, a cross-sectional view of the pixel structure is shown in FIG. 4. The structure includes a thin-film transistor T, a storage capacitor CS, and a pixel electrode PE.

The thin-film transistor T includes a metal oxide semiconductor layer 102 (including a source region S, a drain region D and a channel region CH), a gate G, a source electrode SE and a drain electrode DE. The metal oxide semiconductor layer 102 (including the source region S, the drain region D and the channel region CH) is located on the substrate 100. Especially, the source region S and the drain region D of the metal oxide semiconductor layer 102 have a conductive region 102a. The conductive region 102a is formed by a reaction of a metal oxide semiconductor layer and at least one of hydrogen group and hydroxyl group, or includes In, Al, Ga, Sn, Zn, or Hf. The gate G is located above the channel region CH of the metal oxide semiconductor layer 102. A first insulating layer 104 and a second insulating layer 106 are included between the gate G and the metal oxide semiconductor layer 102. According to this exemplary embodiment, the second insulating layer 106 is located below the gate G, so the second insulating layer 106 serves as an insulting layer of the gate. According to another exemplary embodiment, the second insulating layer 106 may be omitted. At this time, the first insulating layer 104 located below the gate G (including a barrier layer 104b and an intermediate layer 104a) serves as an insulting layer of the gate. The dielectric layer 110 covers the gate G. The source electrode SE and the drain electrode DE are located above the dielectric layer 110, and are electrically connected to the source region S and the drain region D respectively. In addition, a protection layer 120 further covers the dielectric layer 110. The material of the protection layer 120 may be an inorganic insulating material, an organic material, or a double-layer of the two.

The storage capacitor CS is formed by a drain bottom-electrode BE and a drain top-electrode TE. According to this exemplary embodiment, one part of the metal oxide semiconductor layer 102 serves as the drain bottom-electrode BE of the storage capacitor. The gate G serves as a self-alignment mask when the source region S and the drain region D of the metal oxide semiconductor layer 102 form the conductive region 102a, so the conductive region 102a may also be form in the drain bottom-electrode BE of the metal oxide semiconductor layer 102. In addition, the drain top-electrode TE of the storage capacitor CS is defined at the same time with the forming of the source electrode SE and the drain electrode DE, so the drain top-electrode TE, the source electrode SE and the drain electrode DE have the same material and belong to the same layer. The dielectric layer 110 between the drain top-electrode TE and the drain bottom-electrode BE serves as a capacitance dielectric layer of the storage capacitor CS. Similarly, by using the above method, a source top-electrode (not shown) may also be selectively manufactured on a source region, or simultaneously forming source and drain top-electrodes (not shown) on both the source and drain regions, so as to form the storage capacitor CS.

The pixel electrode PE is located on the protection layer 120. The pixel electrode PE is electrically connected to the drain electrode DE. According to this exemplary embodiment, the pixel electrode PE is electrically connected to the drain electrode DE through a contact window in the protection layer 120. The pixel electrode PE may be of a transparent electrode material or reflective electrode material. The transparent electrode material includes indium tin oxide (ITO), indium zinc oxide (IZO), aluminum tin oxide (ATO), aluminum zinc oxide (AZO), indium-gallium-zinc oxide (IGZO) or any other suitable metal oxide material. The reflective electrode materials include metal with high reflectivity.

Figure 3G:
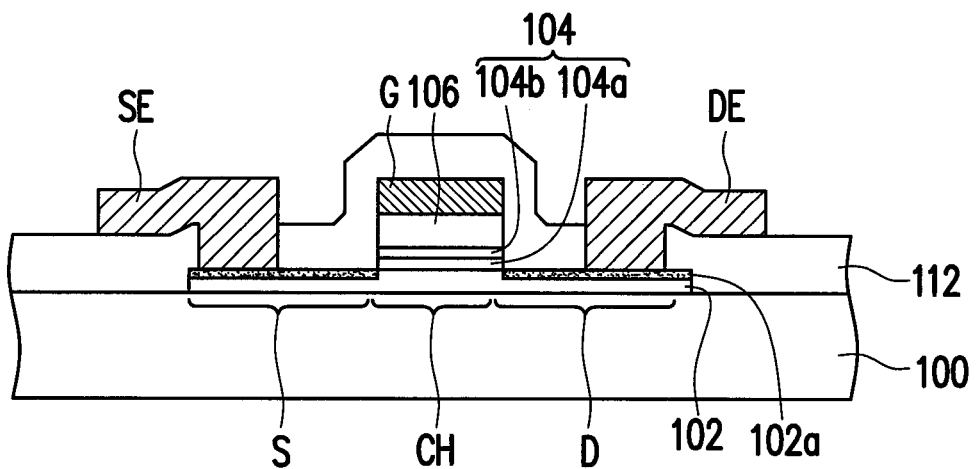
Figure 5:
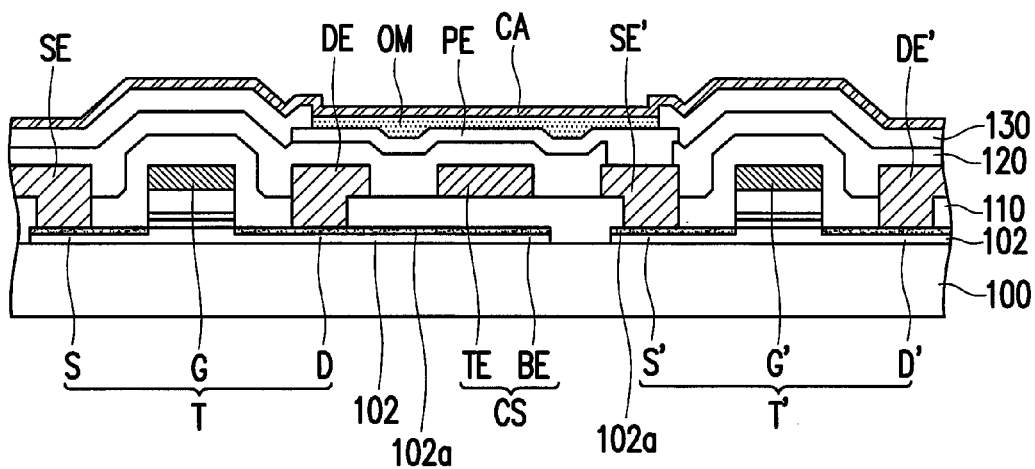
FIG. 5 is a schematic cross-sectional view of a pixel structure of an organic light emitting display (OLED) according to an exemplary embodiment.

In addition, the thin-film transistor described in FIG. 1E, FIG. 2C and FIG. 3G may be used in a pixel structure of an organic electroluminescent display. Referring to FIG. 5, the pixel structure includes thin-film transistors T and T', a storage capacitor CS, a pixel electrode PE, a light-emitting material layer OM, and an electrode film CA.

The thin-film transistor T includes a metal oxide semiconductor layer 102 (including a source region S, a drain region D and a channel region CH), a gate G, a source electrode SE and a drain electrode DE. The thin-film transistor T' includes a metal oxide semiconductor layer 102 (including a source region S', a drain region D' and a channel region CH'), a gate G', a source electrode SE' and a drain electrode DE'. The thin-film transistor T serves as a switch device of the pixel structure. The thin-film transistor T' serves as a driving device of the pixel structure. In addition, the thin-film transistors T and T' may be manufactured by using the method described in FIG. 1A to FIG. 1E, or FIG. 2A to FIG. 2C or the method described in FIG. 3A to FIG. 3G. It should be noted that, the source region S, the drain region D, the source region S', and the drain region D' of the metal oxide semiconductor layer 102 have a conductive region 102a. The conductive region 102a is formed by a reaction of a metal oxide semiconductor layer and the at least one of hydrogen group and hydroxyl group, or includes In, Al, Ga, Sn, Zn, or Hf.

The capacitor CS includes a bottom-electrode BE and a top-electrode TE. According to this exemplary embodiment, one part of the metal oxide semiconductor layer 102 serves as the bottom-electrode BE of the capacitor. The gate G serves as a self-alignment mask when forming the conductive region 102a in the source region S and the drain region D of the metal oxide semiconductor layer 102, so the conductive region 102a may also be formed in the bottom-electrode BE of the metal oxide semiconductor layer 102. In addition, the top-electrode TE of the storage capacitance CS is defined at the same time with the forming of the source electrode SE and the drain electrode DE, so the top-electrode TE, the source electrode SE and the drain electrode DE have the same material and belong to the same layer. The dielectric layer 110 between the top-electrode TE and the bottom-electrode BE serves as a capacitance dielectric layer of the storage capacitor.

The pixel electrode PE is located on the protection layer 120. The pixel electrode PE is electrically connected to the source electrode SE' of the thin-film transistor T'. According to this exemplary embodiment, the pixel electrode PE is electrically connected to the source electrode SE' through a contact window in the protection layer 120. A third insulating layer 130 is disposed above the pixel electrode PE. The third insulating layer 130 covers the protection layer 120, and patterns and exposes the pixel electrode PE. The third insulating layer 130 may be an organic insulating layer or an inorganic insulating layer.

The light-emitting material layer OM is located at the pixel electrode PE exposed by the third insulating layer 130. The electrode film CA covers the third insulating layer 130 and the light-emitting material layer OM. The light-emitting material layer OM may be an organic light-emitting material, which may be a light-emitting material with a red light-emitting material, a green light-emitting material, a blue light-emitting material, a white light-emitting material cooperated with a color filter, or another material with other colors. The electrode film CA may fully cover the third insulating layer 130 and the light-emitting material layer OM. The material of the electrode film CA may be a metal material or a transparent conductive material.

In order to prove that the insulating layer disposed below the gate may block moisture and oxygen gas (i.e., the hydrogen group and hydroxyl group) to ensure the stability of the channel region of the thin-film transistor, the following will be described with an example and a comparative example.

Figure 6A:
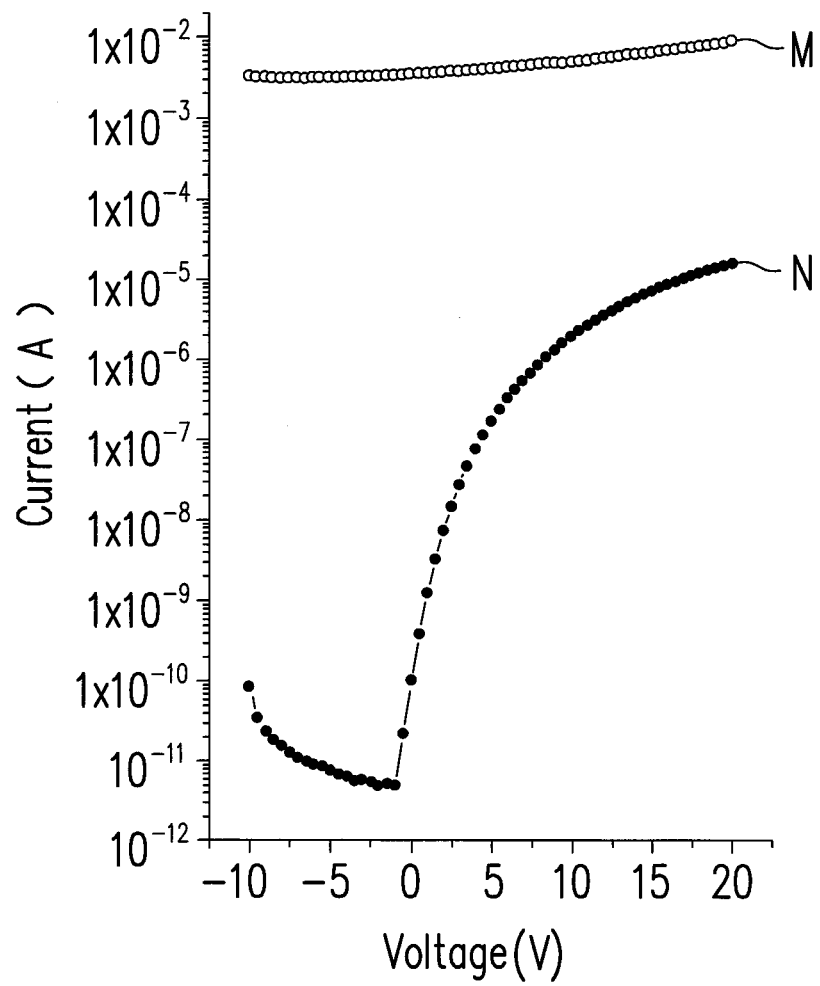
FIG. 6A to FIG. 6B are schematic views of a relation between a voltage and a current of a thin-film transistor according to a comparative example and an example.

In the comparative example, the thin-film transistor is a top gate type oxide thin-film transistor. The metal oxide semiconductor layer is InGaZnO with the thickness of 50 nm. A $SiO_2$ layer and a PVP layer are disposed between the gate and the metal oxide semiconductor layer. The PVP layer serves as a gate insulating layer. The relation between a voltage and a current of a thin-film transistor of the comparative example is shown in FIG. 6A. In FIG. 6A, the curve N is a relation curve of the voltage and the current of a thin-film transistor when the thin-film transistor is just manufactured. The curve M is a relation curve of the voltage and the current of the thin-film transistor one day later. It can be seen from FIG. 6A that the thin-film transistor, after one day, may have a short-circuit state. The main reason is that the PVP layer absorbs water molecules or oxygen molecules, and that hydroxyl group may be diffused to the channel region of the metal oxide semiconductor layer, so that a short-circuit phenomenon occurs.

Figure 6B:
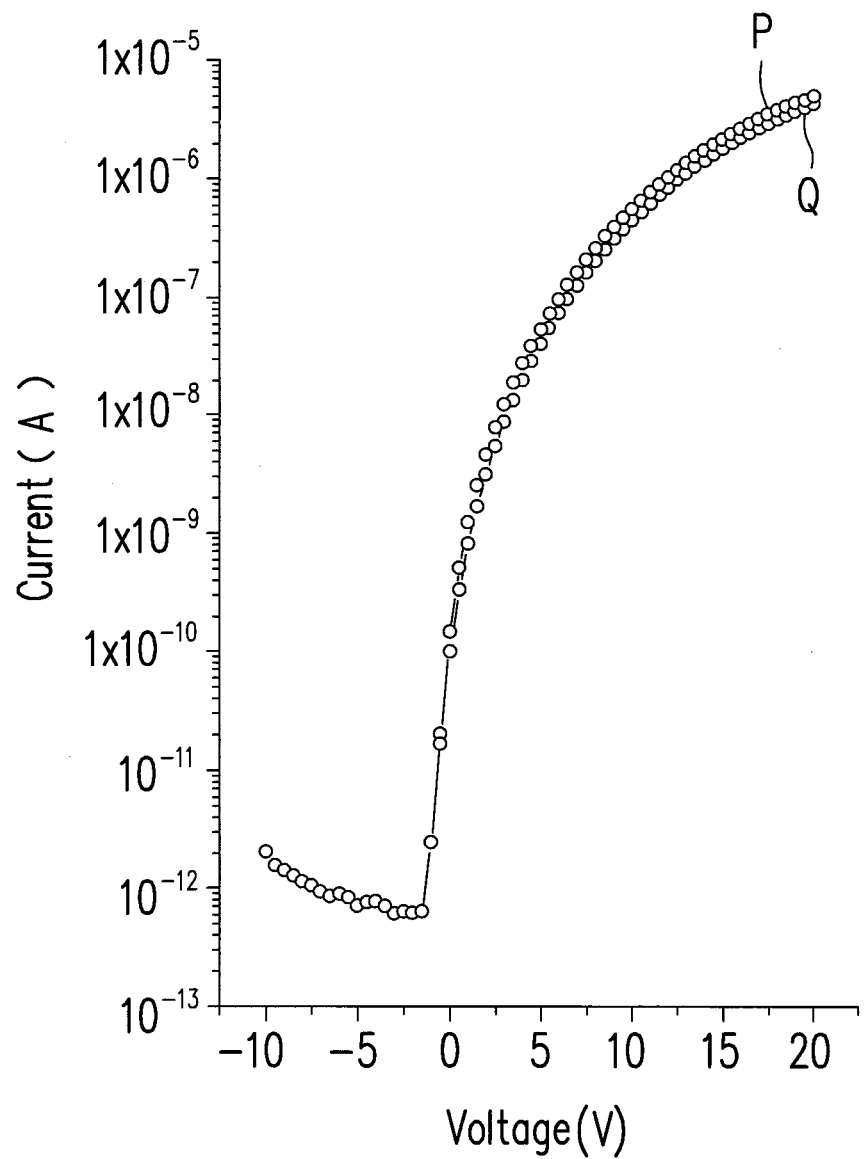

In an example, the thin-film transistor is a top gate type oxide thin-film transistor. The metal oxide semiconductor layer is InGaZnO with the thickness of 50 nm. A $SiO_2$ layer and a $SiN_X$ layer are disposed between the gate and the metal oxide semiconductor layer. The $SiN_X$ layer serves as a gate insulating layer. The relation between the voltage and the current of the thin-film transistor of the example is shown in FIG. 6B. In FIG. 6B, the curve P is a relation curve of the voltage and the current of a thin-film transistor when the thin-film transistor is just manufactured. The curve Q is a relation curve of the voltage and the current of the thin-film transistor 21 days later. It can be seen from FIG. 6B that the thin-film transistor, after 21 days, does not have an obvious electrical property change. The main reason is that the $SiN_X$ barrier layer may prevent hydrogen group and hydroxyl group from being diffused to the channel of the metal oxide semiconductor layer, and therefore the thin-film transistor is enabled to have a certain electrical stability.

It should be noted that, as can be seen from FIG. 6A, the hydrogen group and/or hydroxyl group in the PVP layer may be diffused to the channel of the metal oxide semiconductor layer to trigger a short-circuit in the device, so it an be further proved that the adopted PVP layer having hydrogen group and/or hydroxyl group described in the previous exemplary embodiments is capable of making the hydrogen group and/or hydroxyl group be diffused to the source region and the source region so as to increase the conductivity of the source region and the drain region.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method for manufacturing a semiconductor device, comprising:
    sequentially forming a metal oxide semiconductor layer and a first insulating layer on a substrate;
    forming a gate on the first insulating layer;
    patterning the insulating layer by using the gate as an etching mask, so as to expose the metal oxide semiconductor layer on two sides of the gate to serve as a source region and a drain region;
    forming a dielectric layer to cover the gate and the metal oxide semiconductor layer, wherein the dielectric layer composes at least one of hydrogen group and hydroxyl group;
    performing a heating treatment, so that the at least one of hydrogen group and hydroxyl group in the dielectric layer reacts with the source region and the drain region, wherein a temperature of the heating treatment is between 100° C. and 500° C.; and
    forming a source electrode and a drain electrode, wherein the source electrode and the drain electrode are electrically connected to the source region and the drain region respectively.

2. The method for manufacturing the semiconductor device according to claim 1, wherein the dielectric layer comprises polyvinylpyrrolidone (PVP), polyvinyl alcohol (PVA), polyacrylates, cinnamate-based polyvinylphenols (Ci-PVP), silicon nitride (SiNX), or SiO2.

3. The method for manufacturing the semiconductor device according to claim 1, wherein the concentration of the at least one of hydrogen group and hydroxyl group in the dielectric layer is higher than 1E18 cm−3.

4. The method for manufacturing the semiconductor device according to claim 1, wherein the metal oxide semiconductor layer comprises zinc oxide (ZnO) doped with indium (In), aluminum (Al), gallium (Ga), stannum (Sn), zinc (Zn) or hafnium (Hf), or Ga and In co-doped ZnO (IGZO).

5. The method for manufacturing the semiconductor device according to claim 1, wherein the first insulating layer comprises an intermediate layer and a barrier layer, the intermediate layer is located between the barrier layer and the metal oxide semiconductor layer, the intermediate layer comprises silicon oxide, Y2O3, Ta2O5, or HfO2, and the barrier layer comprises SiNX, or aluminum oxide.

6. The method for manufacturing the semiconductor device according to claim 1, wherein before forming the gate, the method further comprises forming a second insulating layer on the first insulating layer, and when patterning the first insulating layer by using the gate as the etching mask, the method further comprises patterning the second insulating layer.

7. The method for manufacturing the semiconductor device according to claim 6, wherein the second insulating layer comprises silicon oxide, silicon nitride, silicon oxynitride, PVP, PVA, polyacrylates, Ci-PVP, parylenes or photoacryl.

8. The method for manufacturing the semiconductor device according to claim 1, wherein when forming the source electrode and the drain electrode, the method further comprises forming a source top-electrode and a drain top-electrode on the dielectric layer, and a storage capacitor is formed by the source top-electrode the source region and by the drain top-electrode and the drain region.

9. The method for manufacturing the semiconductor device according to claim 1, further comprising:
    forming a protection layer to cover the dielectric layer, the source electrode and the drain electrode; and
    forming a pixel electrode on the protection layer, wherein the pixel electrode is electrically connected to the drain electrode or the source electrode.

10. The method for manufacturing the semiconductor device according to claim 9, further comprising:
    forming a light-emitting material layer on the pixel electrode; and
    forming an electrode film on the light-emitting material layer.

11. A method for manufacturing a semiconductor device, comprising:
    sequentially forming a metal oxide semiconductor layer and a first insulating layer on a substrate;
    forming a gate on the first insulating layer;
    patterning the insulating layer by using the gate as an etching mask, so as to expose the metal oxide semiconductor layer on two sides of the gate to serve as a source region and a drain region;
    forming a doped layer to cover the gate and the metal oxide semiconductor layer, wherein the doped layer composes at least one of hydrogen group and hydroxyl group, or comprises a dopant comprising indium (In), aluminum (Al), gallium (Ga), stannum (Sn), zinc (Zn) or hafnium (Hf);
    performing a heating treatment, so that the at least one of hydrogen group and hydroxyl group in the doped layer reacts with the source region and the drain region, or the dopant of the doped layer is diffused to the source region and the drain region, wherein a temperature of the heating treatment is between 100° C. and 500° C.;
    removing the doped layer;
    forming a dielectric layer to cover the gate, the source region and the drain region; and
    forming a source electrode and a drain electrode, wherein the source electrode and the drain electrode are electrically connected to the source region and the drain region respectively.

12. The method for manufacturing the semiconductor device according to claim 11, the concentration of the at least one of hydrogen group and hydroxyl group in the doped layer or the concentration of the indium (In), aluminum (Al), gallium (Ga), stannum (Sn), zinc (Zn) or hafnium (Hf) in the doped layer is higher than 1E18 cm−3.

13. The method for manufacturing the semiconductor device according to claim 11, wherein the metal oxide semiconductor layer comprises zinc oxide (ZnO) doped with indium (In), aluminum (Al), gallium (Ga), stannum (Sn), zinc (Zn) or hafnium (Hf), or Ga and In co-doped ZnO (IGZO).

14. The method for manufacturing the semiconductor device according to claim 11, wherein the first insulating layer comprises an intermediate layer and a barrier layer, the intermediate layer is located between the barrier layer and the metal oxide semiconductor layer, the intermediate layer comprises silicon oxide, Y2O3, Ta2O5, or HfO2, and the barrier layer comprises SiNX, or aluminum oxide.

15. The method for manufacturing the semiconductor device according to claim 11, wherein before forming the gate, the method further comprises forming a second insulating layer on the first insulating layer; and when patterning the first insulating layer by using the gate as the etching mask, the method further comprises patterning the second insulating layer.

16. The method for manufacturing the semiconductor device according to claim 15, wherein the second insulating layer comprises silicon oxide, silicon nitride, silicon oxynitride, polyvinyl pyrrolidone (PVP), polyvinyl alcohol (PVA), polyacrylates, cinnamate-based polyvinylphenols (Ci-PVP), parylenes or photoacryl.

17. The method for manufacturing the semiconductor device according to claim 11, wherein when forming the source electrode and the drain electrode, the method further comprises forming a source top-electrode and a drain top-electrode on the dielectric layer, and a storage capacitor is formed by the source top-electrode and the source region and by the drain top-electrode and the drain region.

18. The method for manufacturing the semiconductor device according to claim 11, further comprising:
    forming a protection layer to cover the dielectric layer, the source electrode and the drain electrode; and
    forming a pixel electrode on the protection layer, wherein the pixel electrode is electrically connected to the drain electrode or the source electrode.

19. The method for manufacturing the semiconductor device according to claim 18, further comprising:
    forming a light-emitting material layer on the pixel electrode; and
    forming an electrode film on the light-emitting material layer.

* * * * *